(12) United States Patent
Stephens

(10) Patent No.: US 7,336,756 B2
(45) Date of Patent: Feb. 26, 2008

(54) REPROGRAMMABLE BI-DIRECTIONAL SIGNAL CONVERTER

(75) Inventor: Alexander R. Stephens, San Luis Obispo, CA (US)

(73) Assignee: Miranova Systems, Inc., San Luis Obispo, CA (US)

(*) Notice: Subject to any disclaimer, the term of this patent is extended or adjusted under 35 U.S.C. 154(b) by 181 days.

(21) Appl. No.: 11/258,834

(22) Filed: Oct. 25, 2005

(65) Prior Publication Data
US 2006/0087459 A1 Apr. 27, 2006

Related U.S. Application Data

(60) Provisional application No. 60/622,102, filed on Oct. 25, 2004, provisional application No. 60/624,351, filed on Nov. 1, 2004.

(51) Int. Cl.
*H03K 23/68* (2006.01)
*G06F 7/52* (2006.01)
*G06G 7/16* (2006.01)

(52) U.S. Cl. .................. 377/48; 377/49; 327/360
(58) Field of Classification Search .................. None
See application file for complete search history.

(56) References Cited

U.S. PATENT DOCUMENTS

| | | |
|---|---|---|
| 2,954,165 A | 9/1960 | Myers |
| 3,564,218 A | 2/1971 | Lay |
| 3,916,174 A | 10/1975 | Moule |
| 3,976,946 A | 8/1976 | Schroder |
| 4,482,972 A | 11/1984 | Lewis et al. |
| 4,486,845 A | 12/1984 | Duckworth |
| 4,555,793 A | 11/1985 | Benamy |
| 4,658,406 A | 4/1987 | Pappas |
| 4,831,510 A | 5/1989 | Dummermuth et al. |
| 4,884,226 A | 11/1989 | Sakano |
| 4,975,931 A | 12/1990 | Cosand |
| 5,059,924 A | 10/1991 | Jenningscheck |
| 5,127,035 A | 6/1992 | Ishii |
| 5,237,521 A | 8/1993 | Raj et al. |
| 5,256,981 A * | 10/1993 | Fountain ............... 327/69 |
| 5,287,296 A | 2/1994 | Bays et al. |
| 5,335,253 A | 8/1994 | Oliver et al. |
| 5,426,457 A | 6/1995 | Raskin |
| 5,561,449 A | 10/1996 | Raskin et al. |
| 5,821,816 A * | 10/1998 | Patterson ............... 331/1 A |
| 5,905,538 A | 5/1999 | Shuholm et al. |
| 6,081,339 A | 6/2000 | Southam et al. |
| 6,097,782 A | 8/2000 | Foroudi |
| 6,355,927 B1 | 3/2002 | Snyder |
| 6,356,156 B2 * | 3/2002 | Wesolowski ............ 331/10 |

(Continued)

*Primary Examiner*—Kenneth B. Wells
*Assistant Examiner*—Terry L. Englund
(74) *Attorney, Agent, or Firm*—Sinsheimer Juhnke Lebens & McIvor, LLP; Thomas F. Lebens

(57) ABSTRACT

A signal converter is comprised of a plurality of counters ("macro-counters"). In turn, each of the macro-counters is comprised of a plurality of single-bit counters ("micro-counters") that are adapted to receive configuration data in the form of bit fields. The configuration data is comprised of data corresponding to a plurality of coefficients and of data for grouping the micro-counters into the macro-counters. The coefficients are derived from an input signal/output signal ratio of the converter, and control the manner by which the macro-counters generate the output signal. Thus the converter can be programmed by an end-user in the field.

24 Claims, 9 Drawing Sheets

U.S. PATENT DOCUMENTS

| | | |
|---|---|---|
| 6,396,052 B1 | 5/2002 | Barry et al. |
| 6,411,376 B1 | 6/2002 | Southam et al. |
| 6,563,108 B1 | 5/2003 | Stevens et al. |
| 6,577,985 B2 | 6/2003 | Scalf |
| 6,789,041 B1 | 9/2004 | Stephens |
| 2005/0111609 A1 | 5/2005 | Stephens |

* cited by examiner

REPROGRAMMABLE BI-DIRECTIONAL SIGNAL CONVERTER

CROSS REFERENCE TO RELATED APPLICATIONS

This claims priority from provisional application No. 60/622,102, filed Oct. 25, 2004, and from provisional application No. 60/624,351, filed Nov. 1, 2004, both of which such applications are incorporated herein by reference.

FIELD OF INVENTION

This relates to converting signals, and more particularly to the conversion of bi-directional signals so that an input signal includes indicia corresponding to a distance, in time or position, and that a converted output signal comprises further indicia, wherein the input signal corresponds to a non-integral multiple of the converted output signal.

BACKGROUND

The need for converting signals can be shown, by way of example, in machine tool and position indication applications. Encoders (i.e., rotational, linear etc.) are used to indicate a position of a work piece or a machine part. It is often necessary, however, to convert the output of the encoders (or position indicators) from their fixed number of indicia per unit (e.g., fixed number of indicia per unit of rotation, fixed number of indicia per unit of length, or otherwise) to a number of indicia per unit that corresponds to some aspect of the work piece or machine tool position.

Industry standard rotary shaft encoders, for example, are manufactured with many different numbers of counts per revolution (i.e., many different resolutions) in an attempt to cover the mechanical and precision needs of machine tool position indication applications. However, the resolutions are limited to integer values, i.e., whole numbers of counts per revolution, leaving a user to select only a close match, rather than the precise number of counts per revolution desired, and then to use custom gear trains, or complex processor-based computational conversion systems, in order to obtain a desired number of counts per revolution.

For example, to generate a converted output comprising a count, i.e., a pulse, every 0.5000 inches on the perimeter of a 25.000 inch diameter drum, and whose shaft is mechanically coupled to a 1120 count per revolution, i.e., pulse per revolution, rotary shaft encoder, it is necessary to convert the pulse output of the rotary shaft encoder from a whole number of pulses per revolution to a non-integer number of pulses per revolution.

At the same time, however, for machine tool applications, the converted output must be accurate at various, and varying rotational speeds, and accommodate reversals in direction as, for example, the drum is rotated forward and backward at various and varying speeds.

U.S. Pat. No. 6,789,041 (by the same inventor as the present specification) discloses a converter for receiving an input signal that includes indicia corresponding to a distance, in time or position, and for generating a converted, output signal, so that the input signal is a non-integral multiple of the output signal. This patent is incorporated herein by reference in its entirety. The converter includes a plurality of dual-value, up-down counters that convert a bi-directional input signal into a bi-directional output signal. The counters are chained together and operate in a cascading fashion to provide the output signal. Coefficients that are a function of the non-integral multiple are assigned to each of the plurality of counters thus providing one or two upper count limits for each counter.

However with the converter of U.S. Pat. No. 6,789,041, it is assumed that the counter coefficients have been previously calculated and loaded during manufacture of the converter. After having received such a converter from the manufacturer, the end-user is unable to change and load other coefficients in order to use a different input signal/output signal ratio. Rather, the end-user is required to purchase a different converter or related component when the need arises for a converter having different output ratio. Accordingly, there is a need for a bi-directional signal converter that is field-programmable.

SUMMARY OF THE ILLUSTRATED EMBODIMENTS

In accordance with an embodiment of the invention, a converter is comprised of a plurality of counters ("macro-counters"). In turn, each of the macro-counters is comprised of a plurality of single-bit counters ("micro-counters") that are adapted to receive configuration data in the form of bit fields. The configuration data is comprised of data corresponding to a plurality of coefficients and of data for grouping the micro-counters into micro-counter groups (i.e., the macro-counters). The coefficients are derived from an input signal/output signal ratio of the converter, and control the manner by which the macro-counters generate the output signal. Thus the converter can be programmed by an end-user in the field.

In an alternative embodiment, a first value corresponding to a ratio between an input signal and an output signal is received wherein the ratio is a non-integer. A plurality of coefficients corresponding to the first value is calculated. A first set of data is created that is comprised of data corresponding to the plurality of coefficients and of data for grouping the plurality of counters into a plurality of counter groups. The first set of data is transmitted to the plurality of counters. The plurality of counter groups is adapted to generate the output signal such that a relationship between the input signal and the output signal is on average the ratio.

In another aspect, each of the plurality of counter groups is adapted to produce an output pulse for at least one predetermined number of input pulses in accordance with at least one of the plurality of coefficients.

In another aspect, each of the plurality of counters is a single-bit counter, and the first set of data is bit field data.

In yet another aspect, creating the first set of data includes creating a plurality of binary values as a function of the plurality of coefficients. Each group of the plurality of counter groups has associated therewith at least one of the plurality of coefficients. The number of counters in each group of the plurality of counter groups corresponds to a number of binary bits required to represent an integer value corresponding to the at least one of the plurality of coefficients.

In yet another aspect, the plurality of counters in each of the plurality of counter groups is assembled in order of significant bits of at least one of the plurality of binary values.

There are additional aspects to the present inventions. It should therefore be understood that the preceding is merely a brief summary of some embodiments and aspects of the present inventions. Additional embodiments and aspects are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

These and/or other aspects and advantages of the present invention will become apparent and more readily appreciated from the following description of certain embodiments, taken in conjunction with the accompanying drawings of which:

FIG. 4b is an illustration of a pulse count calculation for the converter of FIG. 4a;

DETAILED DESCRIPTION

Figure 1:
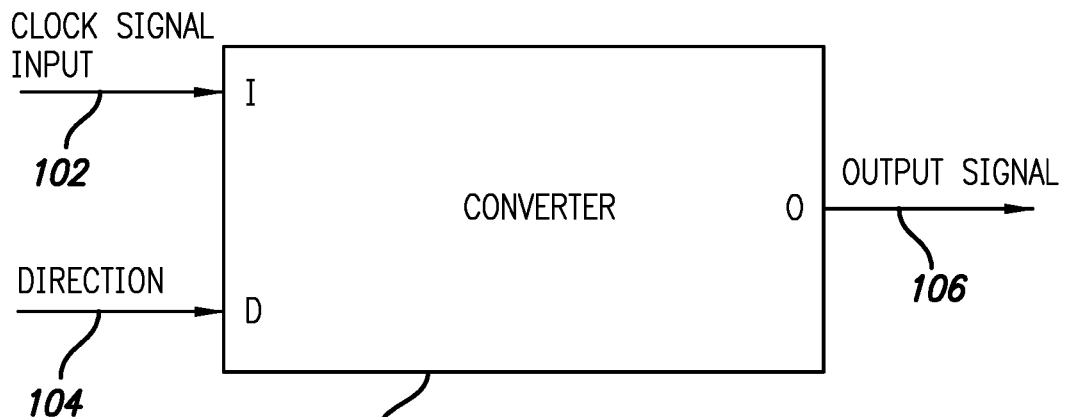
FIG. 1 is a simplified block diagram of a converter for converting a bi-directional input signal to an output signal.

The following description is of the best mode presently contemplated for carrying out the invention. Reference will be made in detail to embodiments of the present invention, examples of which are illustrated in the accompanying drawings, wherein like reference numerals refer to like elements throughout. It is understood that other embodiments may be used and structural and operational changes may be made without departing from the scope of the present invention.

Disclosed is a method and system for converting a bi-directional input signal into a bi-directional output signal so that the input signal is a non-integral multiple of the output signal. A converter is comprised of one or more dual-value, up-down counters that collectively operate to convert the input signal. Each of the counters ("macro-counters") is comprised of a plurality of single-bit counters ("micro-counters") that are adapted to receive configuration data in the form of bit fields. This configuration data is created under the control of an end-user so that the converter can be programmed and re-programmed in the field by the end-user.

Referring to FIG. 1, shown is a block diagram of a converter 100 for converting a bi-directional input signal to an output signal such that, averaged over time, the input signal is a non-integral multiple of the output signal. According to this embodiment, the converter 100 has a clock signal input (I) 102, a direction signal input (D) 104, and a signal output (O) 106.

The clock signal input (I) 102 and direction signal input (D) 104 are coupled to a bi-directional input signal pair, such as an output signal pair from a rotary shaft encoder. The direction signal input (D) 104 indicates to the converter whether the converter 100 is to count up or down with each clock signal input (I) 102 pulse until reaching a zero (or a minimum coefficient) or one of the maximum coefficients, (N) or (N+1).

In operation, the converter 100 converts the clock signal input (I) 102 to the signal output (O) 106 such that the signal input 102 is a non-integral multiple of the signal output 106 by alternately counting clock signal input (I) 102 pulses and generating a signal output (O) 106 pulse each time an integer number, either (N) or (N+1) respectively, of such clock signal input (I) 102 pulses is counted. Counting by the integer number (which is either N or (N+1), as the case may be) is performed in such a ratio as to obtain a number of output signal 106 pulses, such that the input signal 102 is a non-integral multiple of the output signal (O) 106 pulses. The integers N and N+1 are hereafter referred to as maximum coefficients or maximum coefficient pairs, although it will be appreciated by one of ordinary skill in the art that minimum coefficient pairs may also or alternatively be employed. The input signal 102 is advantageously a non-integral multiple of the output signal 106 thus generated.

To illustrate by taking a mathematically simple example, assume that the converter 100 is designed for an output ratio of 3.75, i.e., for every 3.75 input signal pulses, there is to be one output pulse. The integers (N) and (N+1) for this ratio would be 3 and 4, and the converter 100 would be set up to generate one signal output pulse for each 4 (i.e., N+1) input pulses for a total of three cycles, following by the generation of one signal output pulse for each 3 (i.e., N) input pulses for one cycle. Then this pattern is repeated. (The derivation of the integers 3 and 4, and of the use of three cycles will be explained later herein.)

Thus three cycles of generating one output pulse for 4 input pulses, generates a total of 3×1, or 3 output pulses for a group of 3×4, or 12 input pulses. These three cycles then are followed by one cycle of the generation of one output pulse for 3 input pulses. At this point a total of 15 input pulses (i.e., 12+3) have been received by the converter 100 which produced a total of 4 output pulses (i.e., 3+1). Then this overall pattern is repeated. Thus the ratio of 15/4 is the 3.75 design ratio of the converter in this example.

Figure 2:
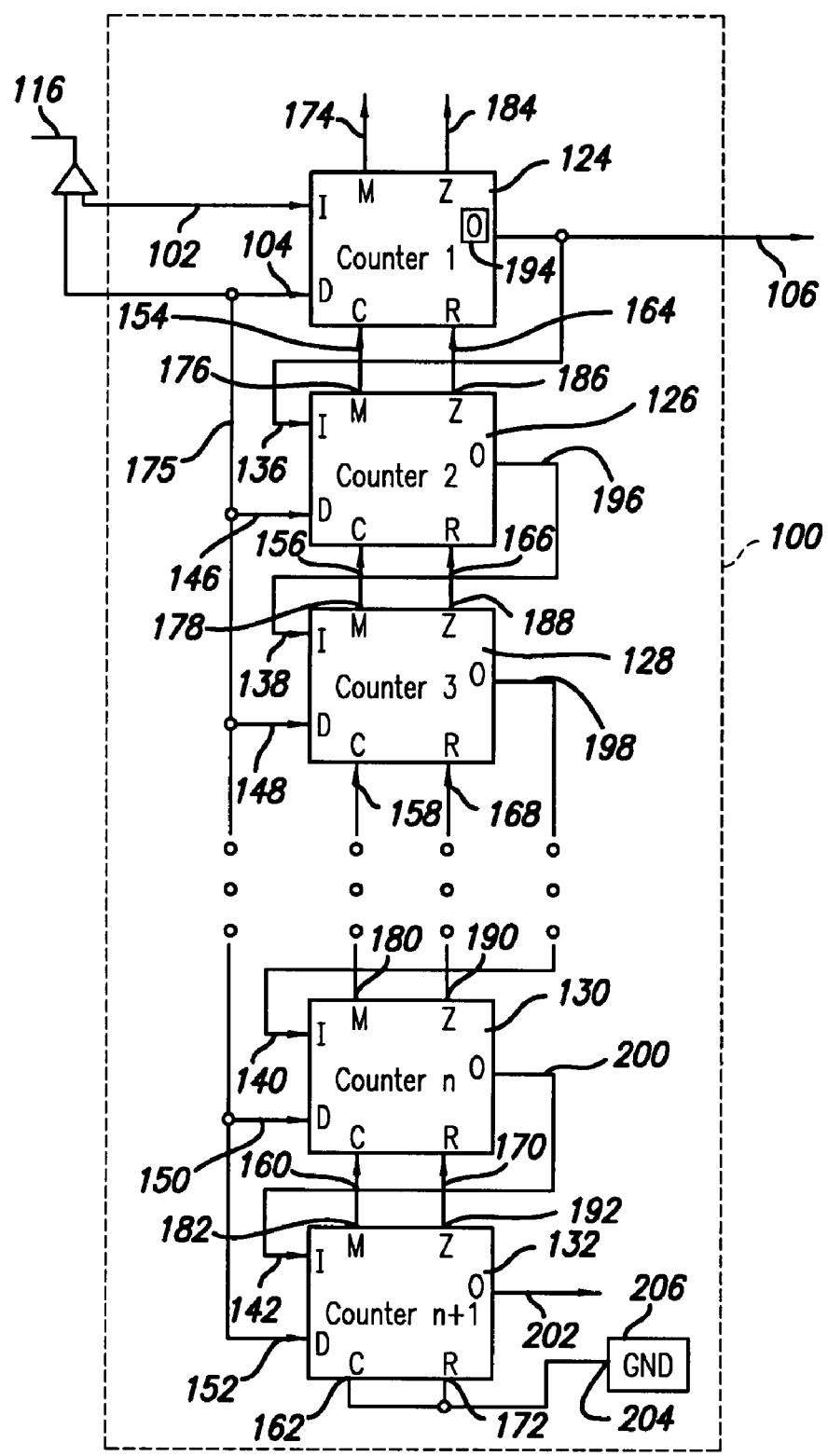
FIG. 2 is a detailed block diagram of the converter of FIG. 1 including a plurality of counters.

Referring next to FIG. 2, shown is a detailed block diagram of a converter 100, such as in FIG. 1, in which a plurality of counters (counter (1) one 124 through counter n+1 132) are employed to convert a bi-directional input signal 116 into a bi-directional output signal 106 such that the input signal 116 is a non-integral multiple of the output signal 106. Shown in this embodiment is a chain of counters (counter one 124 through counter n+1 132), each counter having a clock signal input (I) 102, 136, 138, 140, 142, a direction signal input (D) 104, 146, 148, 150, 152, a count control signal input (C) 154, 156, 158, 160, 162, a reload signal input (R) 164, 166, 168, 170, 172, a maximum count signal output (M) 174, 176, 178, 180, 182, a count zero signal output (Z) 184, 186, 188, 190, 192, and a count pulse output (O) 194, 196, 198, 200, 202.

The clock signal input 102 and direction signal input 104 are coupled to a bi-directional input signal pair 102, 104 as shown in FIG. 1, from which position indicia and direction information are obtained. The direction signal input (D) 104 (FIG. 1) is the direction signal input (D) 146, 148, 150, 152 for each counter (counter one 124 through counter n+1 132), with all such direction signal inputs (D) 146, 148, 150, 152 receiving the same direction signal. The count pulse outputs (O) 194, 196, 198, 200 of counter one 124 through counter n 130 are the clock signal input (I) of a directly subsequent counter. Finally, the count control signal inputs (C) 154, 156, 158, 160 and the reload signal inputs (R) 164, 166, 168, 170 of counter one 124 through counter n 130 are respectively the maximum count signal output (M) 176, 178, 180, 182 and the count zero signal output (Z) 186, 188, 190, 192 of the directly subsequent counter. The count control signal input 162 and the reload signal input 172 of the last counter 132 are electrically connected 204 to ground 206 to be held in a known state.

The last counter 132 may be simplified by eliminating the count control signal input 162 and the reload signal input 204, as these inputs are not used in the last counter 132. In certain implementations, by eliminating the count control signal input 162 and the reload signal input 204 (and simultaneously eliminating the accompanying functionality from the last counter 132) logic resources can be conserved, thus smaller and less expensive logic devices may be employed. The last counter 132 has a single maximum coefficient, instead of a pair of maximum coefficients.

In operation, multiple counters (counter one 124 through counter n+1 132) are cascaded together to alter the ratio of $N_1$ to $N_1+1$ as the maximum coefficient for counter one 124. When counter one 124 generates a count pulse output 106, it also appears as the clock pulse input 136 of counter (2) two 126, thereby incrementing or decrementing its respective count value, depending on whether the direction signal input 104 is at a first or second value thus indicating to either count up or down. So it is with subsequent counters (counter two 126 through counter n 130), as each generates a count pulse output the subsequent counter receives a clock pulse input.

As each subsequent counter (counter two 126 through counter n+1 132) reaches zero or its respective maximum coefficient, it will activate either the respective count zero signal output (Z) 186, 188, 190, 192 or the respective maximum count signal output (M) 176, 178, 180, 182 that is then received respectively by the respective reload signal input (R) 164, 166, 168, 170 or the respective count control signal input (C) 154, 156, 158, 160 of the previous counter. This scheme operates to select whether $N_n$ or $N_n+1$ will be the current maximum coefficient for the respective counter (n).

Additionally, there is a preset and reset capability. Thus, the conversion process may be altered by either resetting all the count values for each counter (counter one 124 through counter n+1 132) to start over at zero or by presetting the count value for each counter to be a specific initial count value.

Figure 3:
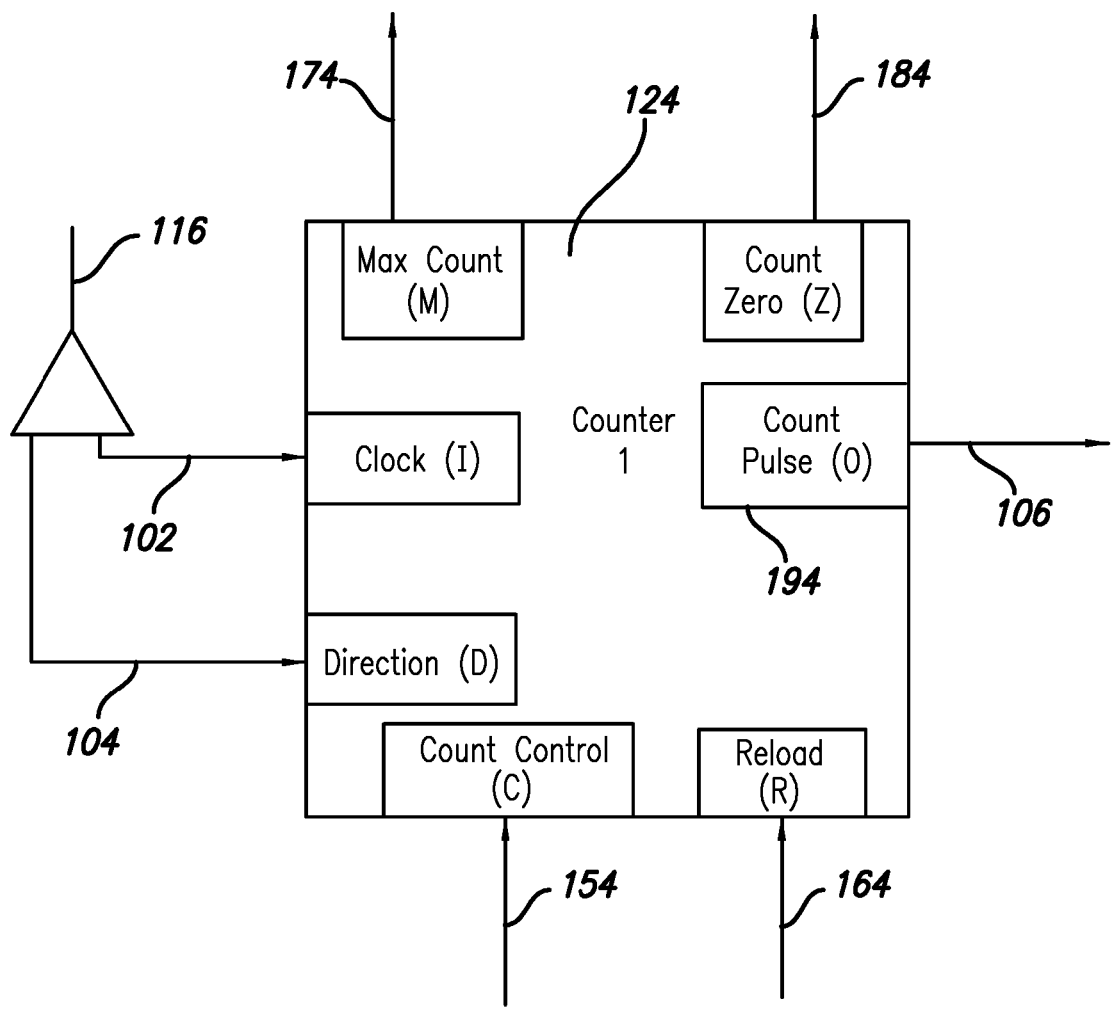
FIG. 3 is a simplified block diagram of one of the counters of FIG. 2.

Referring next to FIG. 3, shown is a block diagram of a counter, such as may be employed as one of the counters of FIG. 2. Shown in this embodiment is a counter 124 having a clock signal input (I) 102, a direction signal input (D) 104, a count control signal input (C) 154, a reload signal input (R) 164, a maximum count signal output (M) 174, a count zero signal output (Z) 184, and a count pulse output (O) 194.

The clock signal input 102 and direction signal input 104 are coupled to a bi-directional input signal pair 116, from which the position indicia and direction information are obtained such as, for example, from an encoder. The count control signal input (C) 154 and reload signal input (R) 164 are coupled to the maximum count signal output (M) 176 and count zero signal output (Z) 186 of a subsequent counter such as counter two 126 of FIG. 2.

In operation, when a pulse is received from the clock signal input 102 a count value for counter one 124 is either incremented or decremented depending on whether the direction signal input 104 is in a first state or a second state, e.g., low or high. For example, if the direction signal input 104 is low, the count value is incremented; if it is high, then the count value is decremented. When the direction signal input 104 is low, and thus the count value is to be incremented, a count control signal input 154 is used to select whether the maximum coefficient for counter one 124 will be $N_1$ or $N_1+1$.

When the count control signal input 154 is in a first state, e.g., low, the maximum coefficient is N. When the count control signal input 154 is in a second state, e.g., high, then the maximum coefficient is N+1. When the direction signal input 104 is high, and thus the count value is to be decremented, a reload signal input 164 is used to select whether to reload the count value with N or N+1 after a count value of zero has been reached.

When the reload signal input 164 is in a first state, e.g., low, the count value will be reloaded with N. When the reload signal input 164 is in a second state, e.g., high, then the count value will be reloaded with N+1.

If the direction signal input 104 is in a first state (e.g., low or not asserted) when the count value reaches the maximum coefficient for counter one 124 (either N or N+1 depending on the count control signal input 154) then a maximum count signal output 174 is asserted. On the next clock signal input pulse 102 a count pulse output 194 is generated from counter one 124, the count value is reset to zero and a count zero signal output 184 is asserted, and the maximum count signal output 174 is not asserted. If the direction signal input 104 is, e.g., asserted when the count value reaches zero, the count zero signal output 184 is also e.g., asserted. Likewise, on the next clock signal input pulse 102 a count pulse output 106 is generated from counter one 124, but this time the count value is reloaded with N or N+1 depending on the count control signal input 154, and the maximum count signal output 174 is asserted.

The final output of the circuit is a bi-directional output signal 106 resulting from the train of count pulse outputs 194 such that averaged over time the input signal 116 is a non-integral multiple of the output signal 106. This is a result of the process of using a ratio of maximum coefficients (N and N+1) for conversion as a function of the desired non-integral multiple.

Figure 4A:
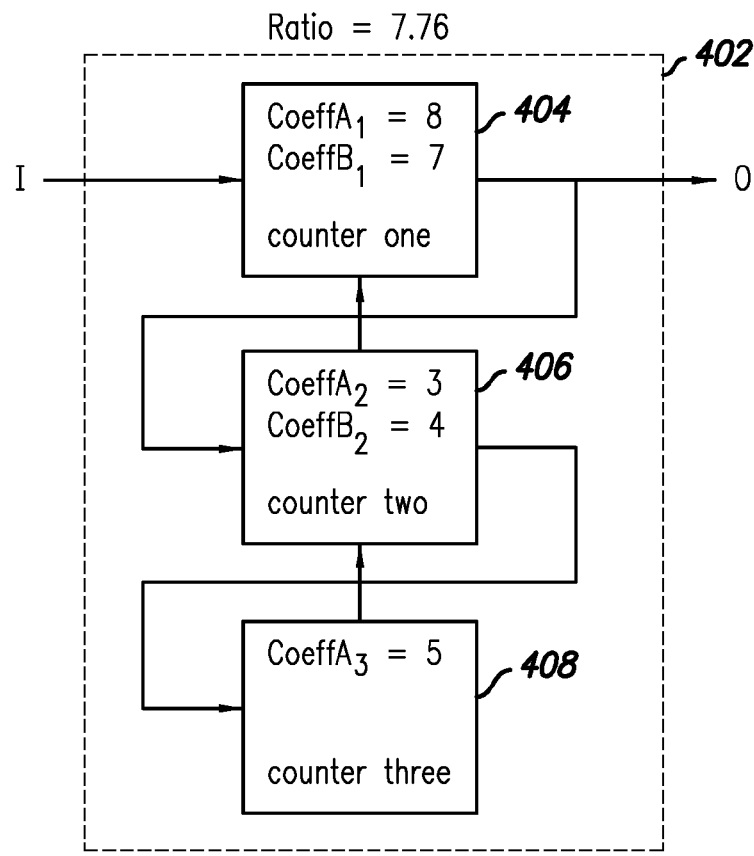
FIG. 4a is a simplified version of the converter of FIG. 2.

The operation of this circuit can be further understood by referring to an example. FIG. 4a is a simplified version of the converter of FIG. 2 wherein it has been determined that only three counters are required for an exemplary converter 402 that is designed for an output ratio of 7.76. It has been determined that counter one 404 has maximum coefficients of 8 and 7 which are referred to as $CoeffA_1$ and $CoeffB_1$, such that $CoeffA_1=8$, and $CoeffB_1=7$. Counter two 406 has maximum coefficients of $CoeffA_2=3$ and $CoeffB_2=4$. Finally, counter three 408 is assigned only one maximum coefficient, $CoeffA_3=5$. The method for deriving these coefficients will explained later herein.

Still referring to FIG. 4a, when $CoeffA_1$ is asserted in counter one 404, then that counter outputs 1 pulse for every 8 input pulses that it receives. Said another way, counter one 404 divides by 8. Similarly, when $CoeffB_1$ is asserted in counter one 404, then the counter divides by 7. Counters two and three 406, 408 operate together to control how frequently counter one divides by 8 versus dividing by 7, such that over time, the overall output ratio is 7.76 in this example.

When $CoeffA_2$ (i.e., 3) of counter two 406 is asserted to counter one 404, then counter one will divide by 8 (i.e., CoeffA$_1$) for three cycles before dividing by 7 (i.e., CoeffB$_1$) for one cycle. When CoeffB$_2$ (i.e., 4) of counter two 406 is asserted to counter one 404, then counter one 404 will divide by 8 for four cycles before dividing by 7 for one cycle. In a similar manner, the CoeffA$_3$ (i.e., 5) in counter three 408 controls the number of cycles that counter two 406 can assert its CoeffA$_2$ on counter one. Thus in this example, counter three 408 requires counter two 406 to assert its CoeffA$_2$ for five cycles, before counter two can assert its CoeffB$_2$ (i.e., 4) for one cycle.

So in this example, counter one 404 will divide by 8 for 3 cycles before dividing by 7 for one cycle, since 3 corresponds to CoeffA$_2$ in counter two 406. Because CoeffA$_3$ in counter three is equal to 5, this pattern is repeated 5 times. After the fifth time, CoeffB$_2$ (i.e., 4) of counter two is asserted to counter one 404, and therefore counter one divides by 8 for four cycles before dividing by 7 for one cycle. Then all counters are reset and the entire process is repeated.

Figure 4B:
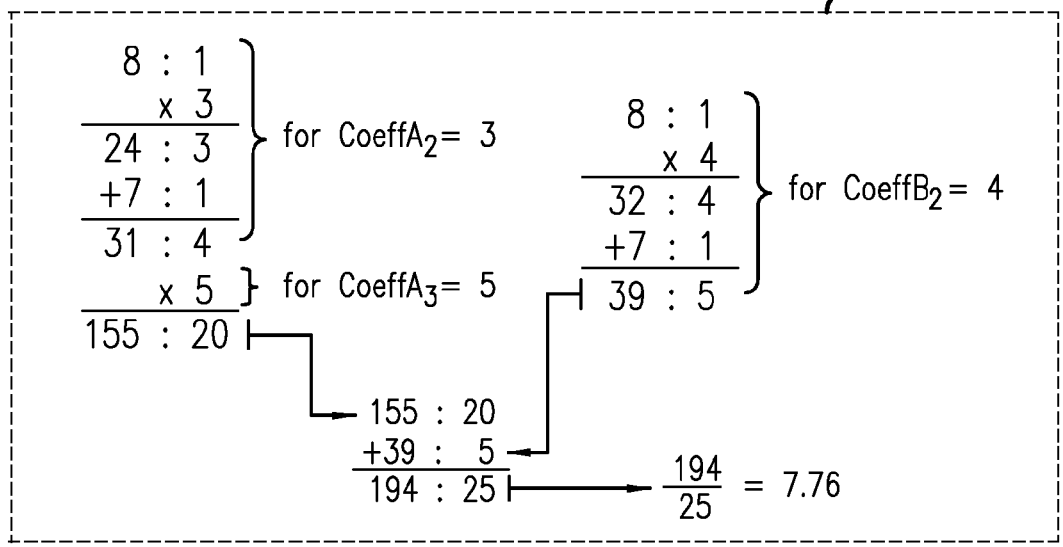

FIG. 4b depicts a pulse count calculation 412 for the example of FIG. 4a. When counter one 404 divides by 8 for three cycles and then divides by 7 for one cycle, an overall input/output ratio is 31:4 [i.e., three cycles of 8:1 ratio=24:3 plus one cycle of 7:1 provides an output of (24+7):(3+1), or 31:4]. Because CoeffA$_3$ of counter three 408 requires an overall cycle of 5 times during which counter two 406 must assert its CoeffA$_2$, the 31:4 ratio is multiplied by 5 giving a count ratio of 155:20.

Because counter two 406 now has gone through the 5 cycles of asserting its CoeffA$_2$ value of 3, its CoeffB$_2$ (i.e., 4) is next asserted to counter one for 1 cycle. Therefore counter one 404 divides by 8 for four cycles and then divides by 7 for one cycle. This provides an overall input/output ratio of 39:5. [i.e., four cycles of 8:1 ratio=32:4 plus one cycle of 7:1 provides an output ratio of (32+7):(4+1), or 39:5]. Since this overall pattern is now complete, the two ratios (i.e., 155:20 and 39:5) are added thereby providing a combined output ratio over time of (155+39):(20+5), or 194:25. Note that this is the overall converter design output ratio, since 194÷25=7.76. In this example, therefore, there is zero error for the converter 402. Note however that for other, more mathematically complex ratios, it may not be possible for a converter having a limited number of counters to have a zero error. Nevertheless such a converter can have a sufficient number of counters (operating in a manner similar to that described for the counters 404, 406, 408 of FIG. 4a) so that any output error will be very small.

According to an embodiment of the invention, the coefficients for use by the counters in a converter are derived by taking the desired input/output signal ratio of the converter and setting a first coefficient to be equal to the integer portion of the ratio. A second coefficient is set to be equal either to the first coefficient plus 1 or the first coefficient minus 1, depending upon whether the decimal portion of the ratio is less than the value 0.5. These first and second coefficients are used by the first counter of the converter.

Next, a first error value is calculated according to a first deviation from the signal ratio that is generated by using only the first coefficient. Similarly, a second error value is calculated according to a second deviation from the signal ratio that is generated by using only the second coefficient. Then, a third coefficient is calculated as a function of the first and second error values. A fourth coefficient is set to be equal either to the third coefficient plus 1 or the third coefficient minus one. Thus these third and fourth coefficients are used by the second counter of the converter.

The process continues as additional error values are calculated as a function of the previously-calculated coefficients and the previously determined error values. Based upon these additional error values, additional coefficients are calculated. This continues until there is a zero error, or until any error value is acceptably small, or until all counters in the converter have been used.

Figure 5A:
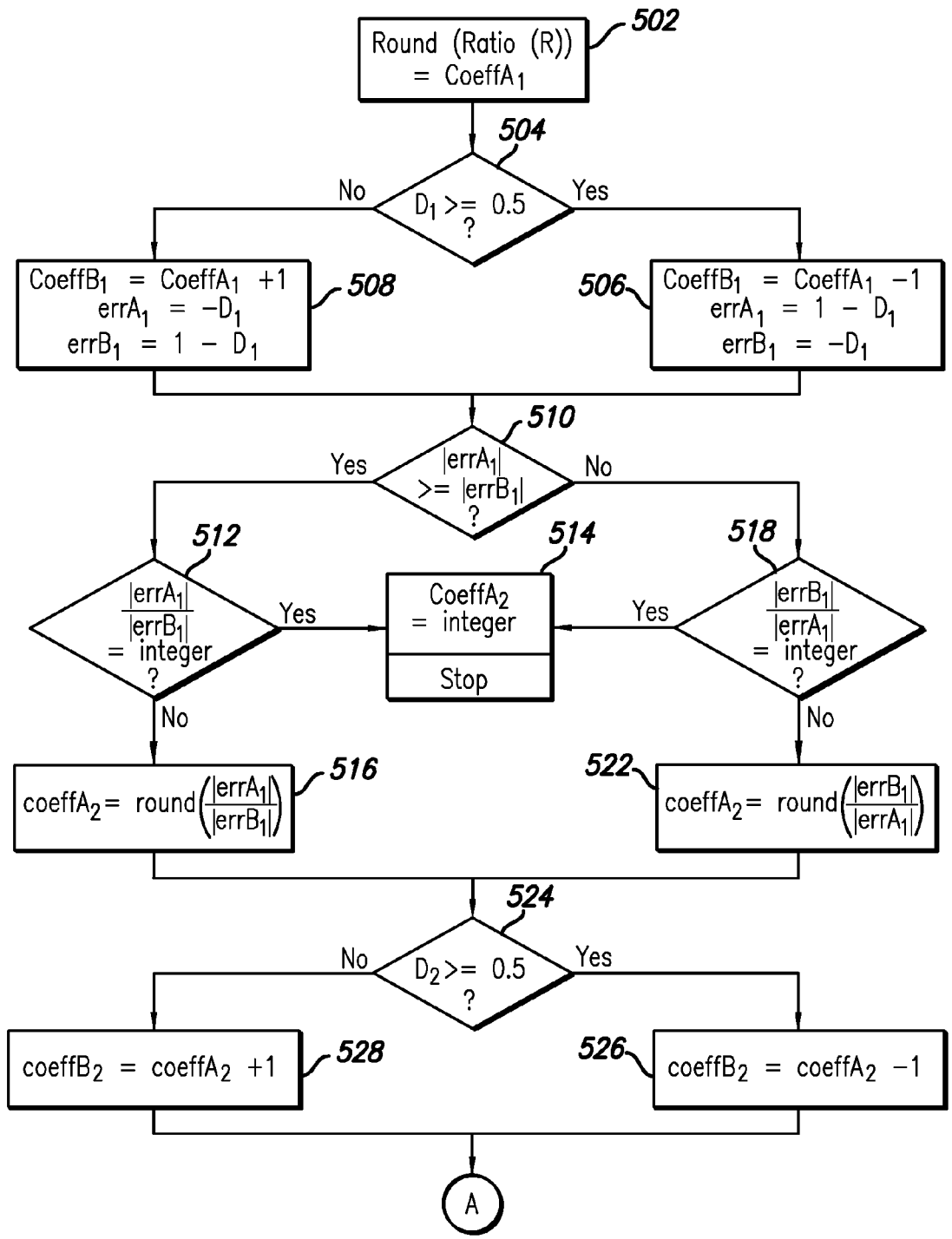
FIGS. 5a and 5b show a simplified block diagram of a process by which coefficients for the counters in a converter can be derived in accordance with an embodiment of the invention.
Figure 5B:
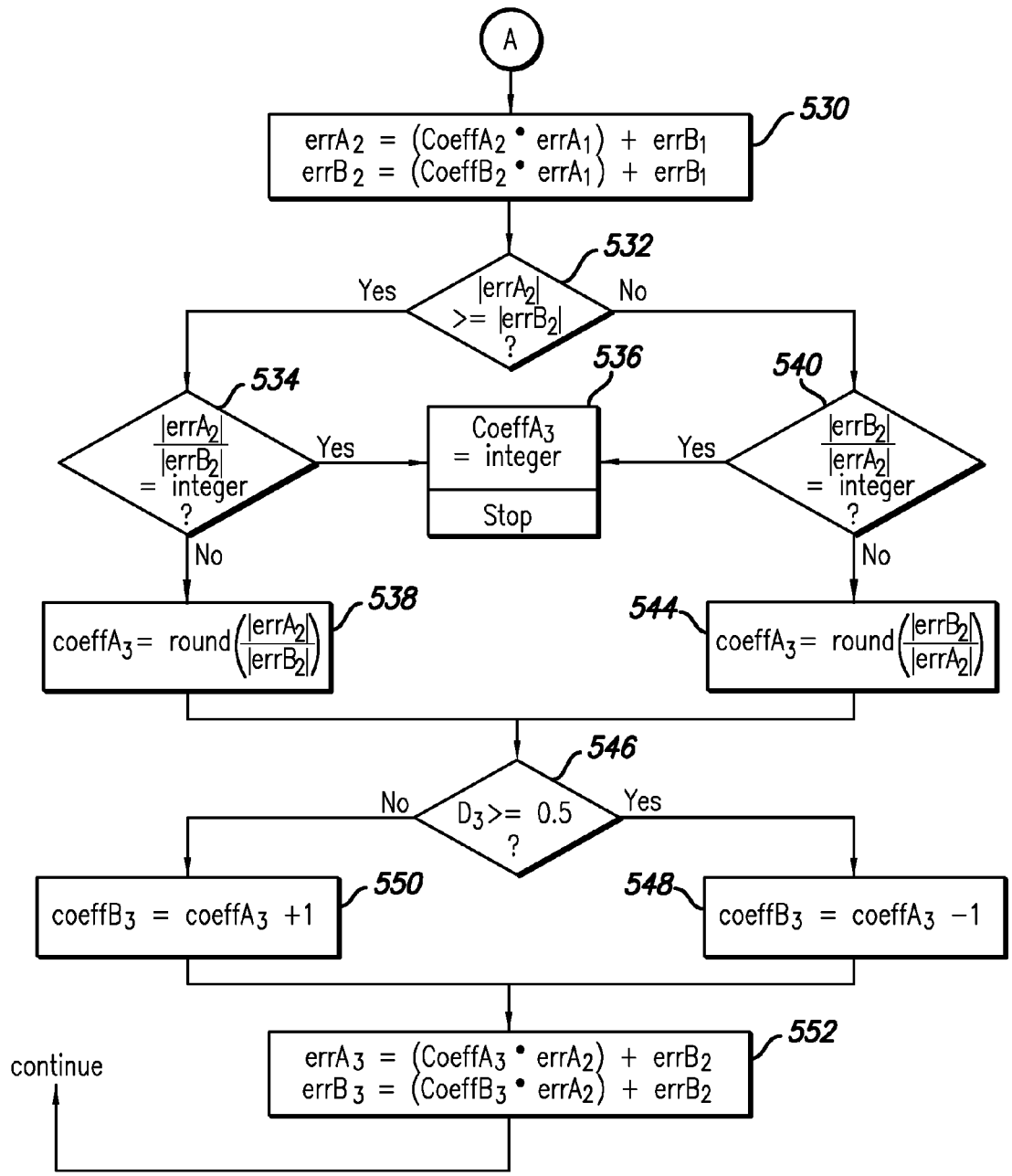

FIGS. 5a and 5b show a process by which the maximum coefficients for the counters in a converter can be derived in accordance with an embodiment of the invention. In step 502, the desired, design converter ratio (R) is received and rounded to the nearest integer which is set equal to the first coefficient, CoeffA$_1$, of the first counter. Next, a determination is made as to whether the decimal component (D$_1$) of the design ratio (R) is greater than or equal to the value of 0.5. (Step 504) If D$_1$ is greater than or equal to 0.5, then CoeffB$_1$ is set to be equal to (CoeffA$_1$−1), an error associated with CoeffA$_1$ (i.e., errA$_1$) is set to be equal to 1−D$_1$, and an error associated with CoeffB$_1$ (i.e., errB$_1$) is set to be equal to −D$_1$ (i.e., the negative of D$_1$). (Step 506) On the other hand, if D$_1$ is less than 0.5, then CoeffB$_1$ is set to be equal to (CoeffA$_1$+1), errA$_1$ is equal to −D$_1$, and errB$_1$ is equal to 1−D$_1$. (Step 508)

Next, a determination is made whether the absolute value of errA$_1$ (i.e., |errA$_1$|) is greater than or equal to the absolute value of errB$_1$ (i.e., |errB$_1$|). (Step 510) If so, then |errA$_1$| is divided by |errB$_1$| and a determination is made whether the result is an integer. (Step 512) If the result is an integer, then that result is set equal to CoeffA$_2$ for use as a maximum coefficient for a second counter, and the process is stopped as there is no need for any further maximum coefficients, including no need for a CoeffB$_2$, for proper operation of the converter. (Step 514) Under these circumstances, the converter will have a zero output error. On the other hand, if the result is not an integer, then the result (i.e., |errA$_1$| divided by |errB$_1$|) is rounded and set equal to CoeffA$_2$ for use by the second counter. (Step 516)

Returning to step 510, if on the other hand, |errA$_1$| is not greater than or equal to |errB$_1$|, then |errB$_1$| is divided by |errA$_1$| and a determination is made whether this result is an integer. (Step 518) If the result is an integer, then this result is set equal to CoeffA$_2$ and the process is stopped as there is no need for any further maximum coefficients, including no need for a CoeffB$_2$, for proper operation of the converter. (Step 514) Under these circumstances, the converter will have a zero output error. On the other hand, if the result is not an integer, then the result (i.e., |errB$_1$| divided by |errA$_1$|) is rounded and set equal to CoeffA$_2$ for use by the second counter. (Step 522)

In step 524, the decimal component (D$_2$) of the result (i.e., the decimal component of |errA$_1$| divided by |errB$_1$|, or of |errB$_1$| divided by |errA$_1$|, as the case may be) is analyzed to determine whether D$_2$ is greater than or equal to the value 0.5. If it is, then CoeffB$_2$ is set equal to CoeffA$_2$−1. (Step 526) Otherwise, CoeffB$_2$ is set equal to CoeffA$_2$+1. (Step 528) After the maximum coefficients (CoeffA$_2$ and CoeffB$_2$) for the second counter have been determined, error values (i.e., errA$_2$ and errB$_2$) associated with those coefficients are calculated according to the following formulas:

$$errA_2 = (CoeffA_2 \cdot errA_1) + errB_1; \text{ and}$$

$$errB_2 = (CoeffB_2 \cdot errA_1) + errB_1. \text{ (Step 530)}$$

In step 532, a determination is made whether |errA$_2$| is greater than or equal to |errB$_2$|. If it is, then |errA$_2$| is divided by |errB$_2$| and a determination is made whether the result is an integer. (Step 534) If the result is an integer, then this result is set equal to CoeffA$_3$ for use as a maximum coefficient by a third counter, and the process is stopped as there is no need for any further maximum coefficients, including no need for a CoeffB$_3$, for proper operation of the converter. (Step 536) Under these circumstances, the converter will have a zero output error. On the other hand, if the result is not an integer, then the result (i.e., |errA$_2$| divided by |errB$_2$|) is rounded and set equal to CoeffA$_3$ for use by the third counter. (Step 538)

Returning to step 532, if on the other hand, |errA$_2$| is not greater than or equal to |errB$_2$|, then |errB$_2$| is divided by |errA$_2$| and a determination is made whether this result is an integer. (Step 540) If the result is an integer, then this result is set equal to CoeffA$_3$ and the process is stopped as there is no need for any further maximum coefficients, including no need for a CoeffB$_3$, for proper operation of the converter. (Step 536) Under these circumstances, the converter will have a zero output error. On the other hand, if the result is not an integer, then the result (i.e., |errB$_2$| divided by |errA$_2$|) is rounded and set equal to CoeffA$_3$ for use by the third counter. (Step 544)

In step 546, the decimal component (D$_3$) of the result (i.e., the decimal component of |errA$_2$| divided by |errB$_2$|, or of |errB$_2$| divided by |errA$_2$|, as the case may be) is analyzed to determine whether D$_3$ is greater than or equal to the value 0.5. If it is, then CoeffB$_3$ is set equal to CoeffA$_3$−1. (Step 548) Otherwise, CoeffB$_3$ is set equal to CoeffA$_3$+1. (Step 550) After the maximum coefficients (CoeffA$_3$ and CoeffB$_3$) for the third counter have been determined, error values (i.e., errA$_3$ and errB$_3$) associated with those coefficients are calculated according to the following formulas:

$$\text{err}A_3 = (\text{Coeff}A_3 \cdot \text{err}A_2) + \text{err}B_2; \text{ and}$$

$$\text{err}B_3 = (\text{Coeff}B_3 \cdot \text{err}A_2) + \text{err}B_2. \text{ (Step 552)}$$

After these error values are calculated, the process continues in a manner similar to that described above from steps 532 to 552, until coefficient pairs have been calculated for all available counters or until the overall converter error that results from the use of the existing counters and maximum coefficients is zero or an acceptably small value.

This method of calculating counter coefficients can be further understood by referring to an example. Using for example the same converter design ratio of 7.76 that was used above in connection with the example of FIGS. 4a and 4b, the first step is to round this number to the nearest integer which in this case is the value 8. Thus 8 is the first coefficient, CoeffA$_1$, for the first counter. (Step 502) Since the decimal portion (D$_1$) of the ratio is 0.76 and is greater than the value 0.5 (Step 504), the second coefficient for the first counter, CoeffB$_1$, is CoeffA$_1$−1, or 7. (Step 506) For the same reason, errA$_1$=0.24 (i.e., 1−D$_1$, or 1−0.76), and errB$_1$ is −0.76 (i.e., −D$_1$ or −0.76). Because |errA$_1$| is less than |errB$_1$|, (i.e., 0.24<0.76) (Step 510), |errB$_1$| is divided by |errA$_1$| for a result of 3.1666. This result is not an integer (Step 518), and therefore 3.1666 is rounded to 3 which is the first coefficient, CoeffA$_2$ of a second counter. (Step 522) The decimal portion (D$_2$) of this result is 0.1666 which is a value less than 0.5 (Step 524), and accordingly, CoeffB$_2$=CoeffA$_2$+1, or 4, which is the second coefficient for the second counter. (Step 528)

Having determined the maximum coefficients (CoeffA$_2$ and CoeffB$_2$) for the second counter to be 3 and 4, the next step is to determine error values (i.e., errA$_2$ and errB$_2$) associated with those coefficients. Thus errA$_2$ is −0.04 as determined by the formula (CoeffA$_2$·errA$_1$)+errB$_1$=(3·0.24)+(−0.76)=0.72−0.76. Similarly, errB$_2$ is 0.20 as determined by the formula (CoeffB$_2$·errA$_1$)+errB$_1$=(4·0.24)+(−0.76)=0.96−0.76. (Step 530)

Since |errB$_2$| is greater than |errA$_2$| (Step 532), |errB$_2$| is divided by |errA$_2$| to get a result of 5 (i.e., 0.20 divided by 0.04). This result is an integer (Step 540), and accordingly CoeffA$_3$ is equal to 5 which is the maximum coefficient for a third counter. (Step 536) There is no need for any coefficient for any CoeffB$_3$, and the process now stops since all necessary coefficients are now derived for a converter having a ratio output of 7.76 and having a zero output error. The coefficients, CoeffA$_N$ and CoeffB$_N$, for the counters for this converter are: 8 and 7 for the first counter, 3 and 4 for the second counter, and 5 for the third counter. These same coefficient values were used above in connection with the example of FIGS. 4a and 4b which demonstrates how counters having these coefficients can generate an output ratio of 7.76.

Thus far, there as been described a method and system for converting an input signal to an output signal by a converter that is comprised of a plurality of dual-value, up-down counters. In accordance with an embodiment of the invention, each of the counters ("macro-counters") is comprised of a plurality of single-bit counters ("micro-counters") that are adapted to receive configuration data in the form of bit fields. The configuration data is comprised of data corresponding to a plurality of coefficients and of data for grouping the micro-counters into micro-counter groups (i.e., macro-counters). The coefficients are derived from the input signal/output signal ratio of the converter, and as previously discussed, control the manner by which the macro-counters generate the output signal. Thus the converter can be programmed by an end-user in the field.

Figure 6:
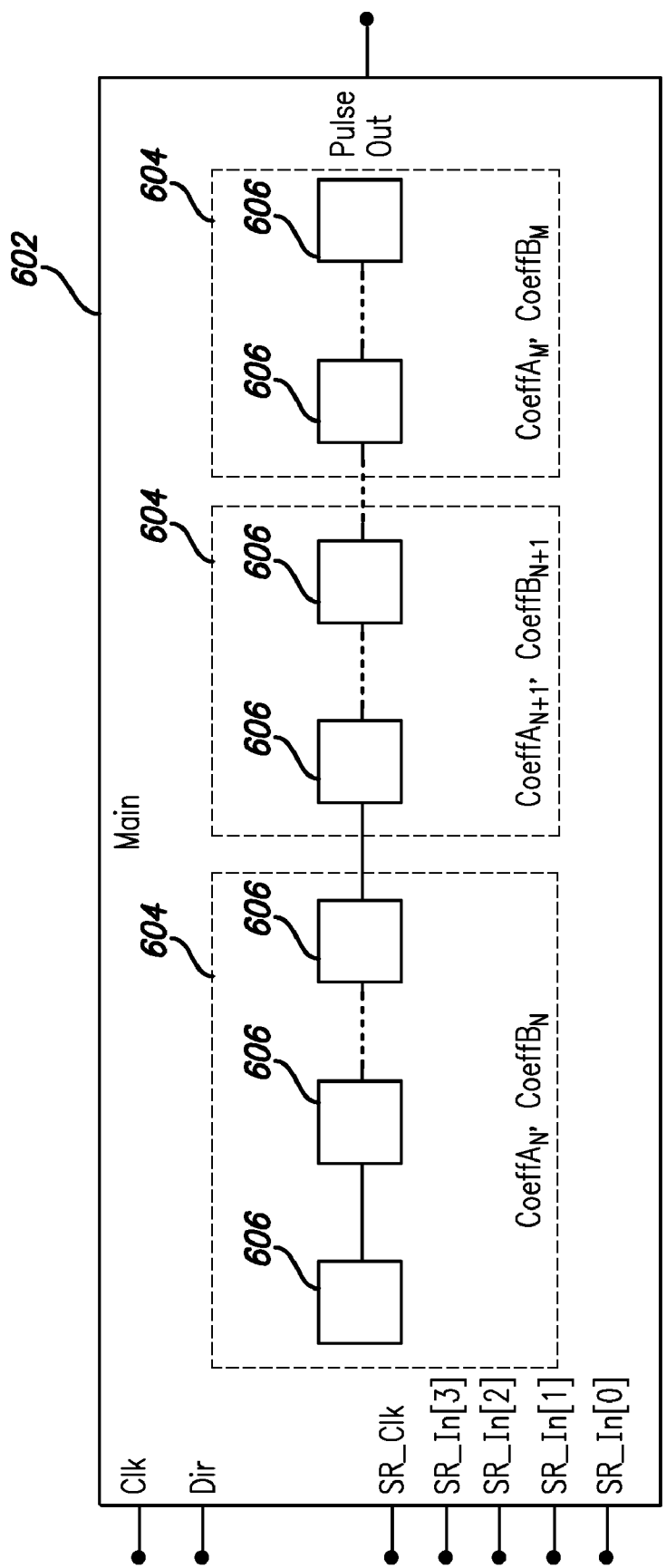
FIG. 6 shows a top-level block diagram of a reprogrammable bi-directional signal converter in accordance with an embodiment of the invention.

FIG. 6 shows a top-level diagram of a reprogrammable bi-directional signal converter 602 in accordance with an embodiment of the invention. The inputs "Clk" and "Dir" are respectively the input clock pulse to be converted and the input direction signal indicating the direction of any given clock signal. Inputs SR_In[3], SR_In[2], SR_In[1], and SR_In[0] are shift register configuration inputs which will be described further below. The input "SR_Clk" is the clock signal on which a given configuration is shifted through the counters. Output "Pulse_Out" is the converted clock signal, and is the final output of the circuit. Contained within the block shown is the logical functionality of a chain of counters as will be described below.

The converter 602 is comprised of a plurality of counters (or "macro-counters"), each of which has associated therewith one or two maximum coefficient values (CoeffA$_N$, CoeffB$_N$), and the operation of which has been previously described. Each of the macro-counters 604, in turn, is formed by a plurality of single-bit micro-counters 606 that receive configuration data in the form of bit fields. The configuration data groups the micro-counters 606 to form the macro-counters 604, as well as controls their operation. As will be explained later, the number of micro-counters 606 forming each macro-counter varies as a function of the coefficient values associated with each macro-counter 604.

Figure 7:
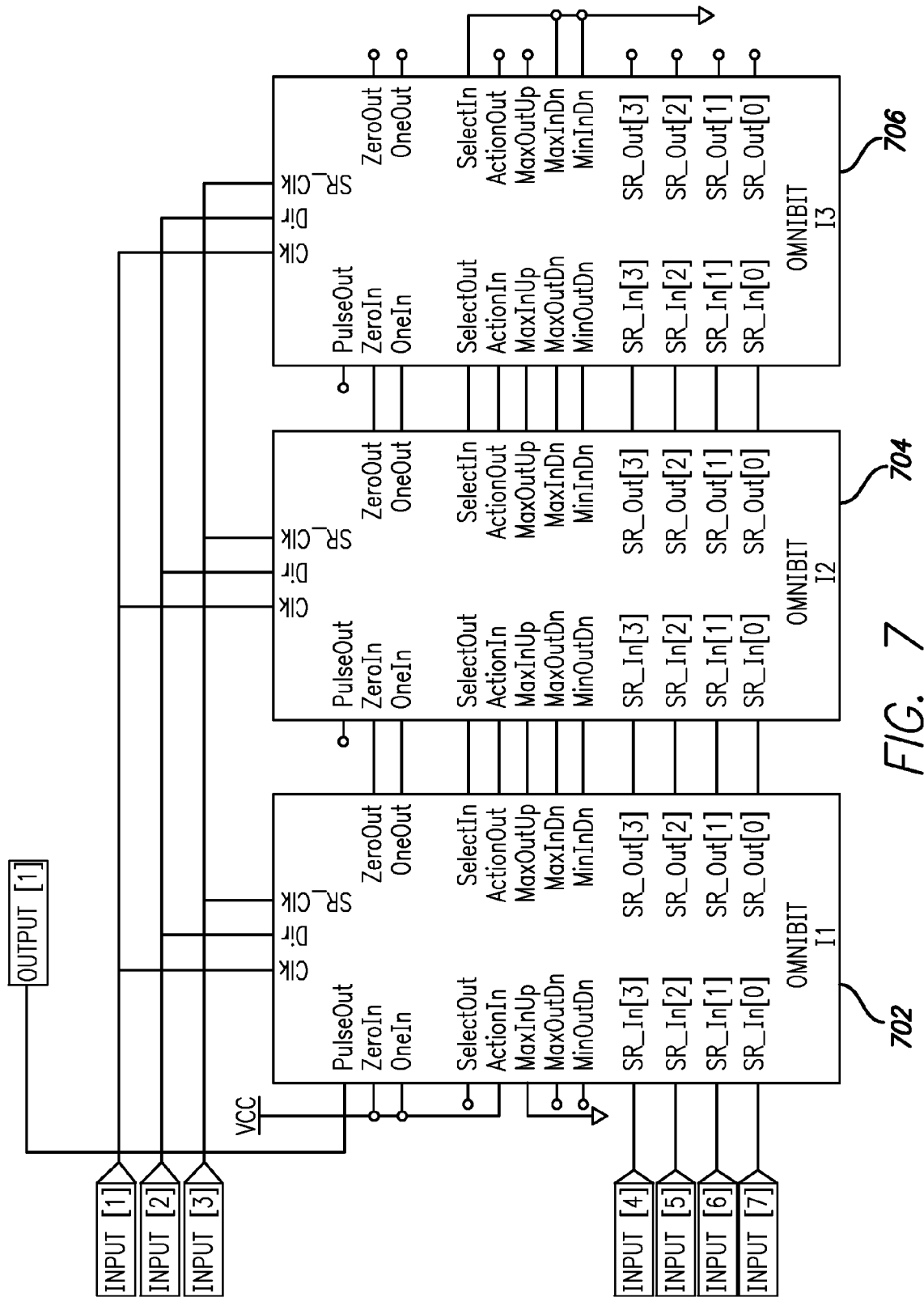
FIG. 7 shows a graphical representation of a plurality of single-bit counters connected together to form a "chain" of counters.
Figure 8:
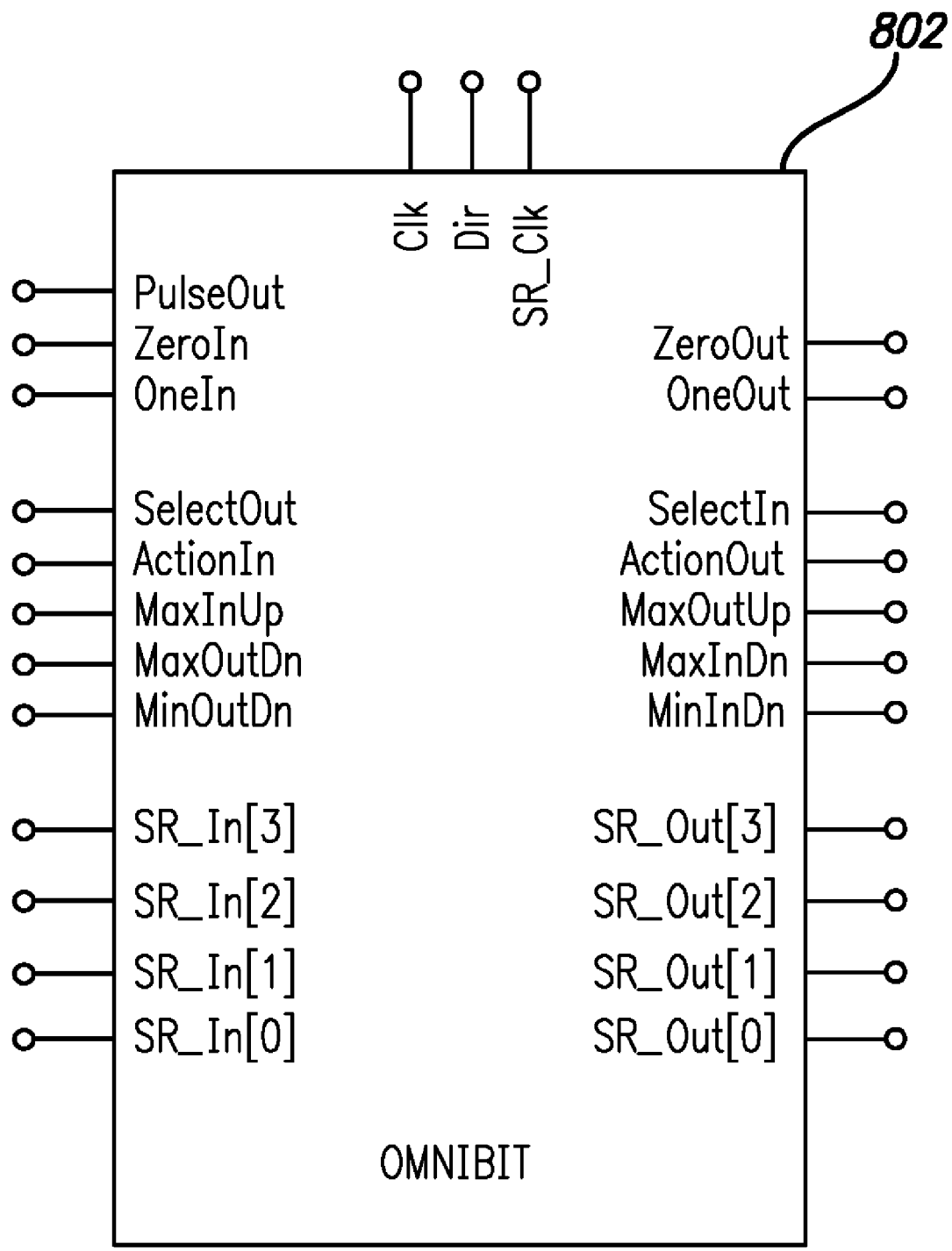
FIG. 8 shows a graphical representation of a single bit counter.

FIGS. 7 and 8 show a graphical representation of a single macro-counter structure and how a plurality of single-bit micro-counters are connected together to form a "chain" of micro-counters. Shown are three micro-counters 702, 704, 706, with inputs and outputs connected as described below, to form a three micro-counter implementation of a macro-counter. In alternative embodiments, however, any number of micro-counters may be connected in such a manner, with micro-counter I1, being the first micro-counter in the chain, I3 being the last micro-counter in the chain, and I2 being a plurality of micro-counters connected in a similar fashion.

The inputs and outputs on the first and last micro-counters 702, 706 that are not connected to another micro-counter that precedes or follows, as the case may be, are either connected to VCC (logic high) or GND (logic low). Outputs that are not used for any particular micro-counter are left unconnected. The inputs and outputs described below are shown as I/O pins on a micro-counter block, which is titled "Omnibit." This is the most basic block of the circuit, and it contains all the logical functionality as previously described.

Referring to FIG. 8 the inputs and outputs of a micro-counter block 802 are summarized as follows:

Input ZeroIn is used to determine if the previous micro-counters in the current macro-counter are at their minimum value. This signal is connected to the output ZeroOut of a previous micro-counter in the chain. In the first micro-counter in the chain, this input is held in the asserted state.

Input OneIn is used to determine if the previous micro-counters in the current macro-counter are at their maximum value. This signal is connected to the output OneOut of the previous micro-counter in the chain. In the first micro-counter in the chain, this input is held in the asserted state.

Input Clk is connected in parallel to all micro-counters in the chain. It is the main count signal input to the overall circuit, and is used to represent an increment of movement to the circuit of either time or distance. This signal is used to clock the circuit, and it is on this signal that a count output signal can be generated if the circuit is configured to do so.

Input Dir is connected in parallel to all micro-counters in the chain. It is the main direction signal input to the circuit, and is used to represent the direction of movement indicated by the Clk input signal.

Input Selectin is used to determine the status of the following micro-counters in the chain. This signal is connected to the output SelectOut of the following micro-counter in the chain. In the last micro-counter in the chain, this input is held in the non-asserted state.

Input ActionIn is used to determine if the current micro-counter should count on the Clk signal input. This signal is connected to the output ActionOut of the previous micro-counter in the chain.

Input MaxInUp is used to determine if the previous micro-counters are at their currently selected maximum value. This signal is connected to the output MaxOutUp of the previous micro-counter in the chain. In the first micro-counter in the chain, this input is held in the non-asserted state.

Input MaxInDn is used to determine if all micro-counters in the current micro-counter group (that forms the macro-counter) are at their currently selected maximum value. This signal is connected to the output MaxOutDn of the next micro-counter in the chain.

Input MinInDn is used to determine if all micro-counters in the current micro-counter group (that forms the macro-counter) are at their minimum value. This signal is connected to the output MinOutDn of the next micro-counter in the chain.

Input SR_Clk is connected in parallel to all micro-counters in the chain. It is the clock signal to shift the values from the inputs SR_In[3], SR_In[2], SR_In[1] and SR_In[0] into the NextGroup, PrevGroup, ValB and ValA internal signals respectively, and from the NextGroup, PrevGroup, ValB and ValA internal signals to the SR_Out[3], SR_Out[2], SR_Out[1], and SR_Out[0].

Inputs SR In[3], SR_In[2], SR_In[1] and SR_In[0] are used to shift configuration information into internal signals NextGroup, PrevGroup, ValB and ValA respectively. The internal signals are loaded with the values on the SR inputs on the edge of input SR_Clk. These signals are connected to the outputs SR_Out[3], SR_Out[2], SR_Out[1], and SR_Out[0] of the previous micro-counter in the chain.

Output ZeroOut is used to indicate that the current micro-counter and any/all previous micro-counters of the current micro-counter group (that forms the macro-counter) has a value of zero loaded in their internal signal Count. This signal is connected to the input ZeroIn of the next micro-counter in the chain. It is asserted when: (input ZeroIn is asserted OR internal signal PrevGroup is non-asserted) AND (internal signal Count equals zero)

Output OneOut is used to indicate that the current micro-counter and any/all previous micro-counters in the current micro-counter group (that forms the macro-counter) has a value of one loaded in their internal signal Count. This signal is connected to the input OneIn of the next micro-counter in the chain. It is asserted when: (input OneIn is asserted OR internal signal PrevGroup is non-asserted) AND (internal signal Count equals one).

Output MaxOutUp is used to indicate that the current micro-counter and any/all previous micro-counters in the current micro-counter group (that forms the macro-counter) are at their currently selected maximum value (ValA if SelectIn is low, or ValB if SelectIn is high). This signal is connected to the input MaxInUp of the next micro-counter in the chain. This signal is asserted when: ((input MaxInUp is asserted AND internal signal PrevGroup is asserted) OR (internal signal PrevGroup is non-asserted)) AND (((internal signal Count EQUALS internal signal ValA) AND input SelectIn is non-asserted) OR ((internal signal Count EQUALS internal signal ValB) AND input SelectIn is asserted)).

Output MaxOutDn is used to indicate that all micro-counters in the current micro-counter group (that forms the macro-counter) have asserted their output MaxOutUp and to pass that indication on to all micro-counters in the group (that all micro-counters in the current group are at their maximum value). This signal is connected to the input MaxInDn of the previous micro-counter in the chain. It is asserted when: (input MaxOutUp is asserted AND internal signal NextGroup is non-asserted) OR (input MaxInDn is asserted AND internal signal NextGroup is asserted).

Output MinOutDn is used to indicate that all micro-counters in the current micro-counter group (that forms the macro-counter) are at their minimum value and to pass that indication on to all micro-counters in the group. This signal is connected to the input MinInDn of the previous micro-counter in the chain. It is asserted when: (output ZeroOut is asserted AND internal signal NextGroup is non-asserted) OR (input MinInDn is asserted AND internal signal NextGroup is asserted).

Output SelectOut is used to indicate that all micro-counters in the current micro-counter group (that forms the current macro-counter) are at their maximum value if input Dir is asserted or minimum value if input Dir is non-asserted, and to pass that indication on to the micro-counters in the previous micro-counter group that forms the previous macro-counter. This is because the next micro-counter group in the chain determines the currently selected maximum value for a micro-counter group. This signal is connected to the input SelectIn of the previous micro-counter in the chain. It is asserted when: (internal signal PrevGroup is non-asserted) AND (output MaxOutUp is asserted AND input Dir is asserted) OR (output ZeroOut is asserted AND input Dir is non-asserted) AND (input MaxInDn is asserted AND input Dir is asserted) OR (input MinInDn is asserted and input Dir is non-asserted) OR (internal signal NextGroup is non-asserted) OR (internal signal PrevGroup is asserted and input SelectIn is asserted).

Output ActionOut is used to indicate that all micro-counters in the current micro-counter group (that forms the current macro-counter) are at their maximum value if input Dir is asserted or minimum value if input Dir is non-asserted, and to pass that indication on to the micro-counters in the next micro-counter group that forms the next macro-counter. This is because the next micro-counter group needs to increment, decrement, load or reset its internal signal Count upon rollover of current micro-counter group. This signal is connected to the input ActionIn of the next micro-counter in the chain. It is asserted when: (internal signal NextGroup is non-asserted AND input ActionIn is asserted) AND (output MaxOutDn is asserted AND input Dir is asserted) OR (output MinOutDn is asserted AND input Dir is non-asserted) OR (internal signal NextGroup is asserted AND input ActionIn is asserted).

Output PulseOut is used to act as an output buffer for the internal signal PulseOutReg. Only the first micro-counter of the chain uses this output, which becomes the final count output signal of the circuit. It is asserted when: (input Clk is asserted AND internal signal PulseOutReg is asserted).

Outputs SR_Out[3], SR_Out[2], SR_Out[1], and SR_Out[0] are outputs that are updated on the edge of input signal SR_Clk, at which time they are set to the current value of internal signals NextGroup, PrevGroup, ValB and ValA respectively. These signals are connected to the inputs SR_In[3], SR_In[2], SR_In[1] and SR_In[0] of the next micro-counter in the chain.

Certain internal signals (not shown) of the micro-counter block 802 are summarized as follows:

Internal signal ValA is used as the first of two maximum values for the current micro-counter. It is loaded on the edge of input SR_Clk. On this edge, this signal is loaded with the current value of input SR_In[0].

Internal signal ValB is used as the second of two maximum values for the current micro-counter. It is loaded on the edge of input SR_Clk. On this edge, this signal is loaded with the current value of input SR_In[1].

Internal signal PrevGroup is used to indicate whether the previous micro-counter in the chain is part of the current micro-counter's group (that forms the macro-counter). It is loaded on the edge of input SR_Clk. On this edge, this signal is loaded with the current value of input SR_In[2].

Internal signal NextGroup is used to indicate whether the next micro-counter in the chain is part of the current micro-counter's group (that forms the macro-counter). It is loaded on the edge of input SR_Clk. On this edge, this signal is loaded with the current value of input SR_In[3].

Internal signal Count is used to provide a register for the current count value. Grouped together with other micro-counters in the chain, macro-counters can be constructed. This signal is updated on the edge of input Clk.

Internal signal Count is incremented when: ((input OneIn is asserted AND internal signal PrevGroup is asserted) OR internal signal PrevGroup is non-asserted) AND (input Dir is asserted AND input ActionIn is asserted AND output MaxOutDn is non-asserted).

Internal signal Count is decremented when: ((input ZeroIn is asserted AND internal signal PrevGroup is asserted) OR internal signal PrevGroup is non-asserted) AND input Dir is non-asserted AND input ActionIn is asserted AND output MinOutDn is non-asserted.

Internal signal Count is reset to zero when: (input ActionIn is asserted AND output MaxOutDn is asserted AND input Dir is asserted).

Internal signal Count is loaded with value of internal signal ValA when: (input ActionIn is asserted and output MinOutDn is asserted AND input Dir is non-asserted and input SelectIn is non-asserted).

Internal signal Count is loaded with value of internal signal ValB when: (input ActionIn is asserted and output MinOutDn is asserted AND input Dir is non-asserted and input SelectIn is asserted).

Internal signal PulseOutReg is used to indicate that a count output of the micro-counter chain is needed. When the current micro-counter group (that forms the macro-counter) rolls over from maximum value to zero or rolls back from zero to maximum value, this signal is asserted. It is asserted when: (input ActionIn is asserted) AND (output MaxOutDn is asserted AND input Dir is asserted) OR (output MinOutDn is asserted AND input Dir is non-asserted).

As previously discussed, the micro-counters require configuration information in order for the circuit to operate as intended. While this information may be preprogrammed or non-volatile, the illustrated embodiment is of a volatile configuration, which is loaded upon powerup through a "SR" interface. Four types of information are required for each micro-counter: ValA, ValB, PrevGroup and NextGroup. A description of these values was discussed above. In order to program the micro-counter arrangement, a desired division ratio for the signal converter is taken and converted into a series of coefficients for use by the macro-counters. The coefficients are then converted to bit-fields of data which in turn, are loaded into the chain of micro-counters via the "SR" interface.

In configuring micro-counters, first a desired division ratio is received, via a serial link, and stored it into an internal memory. The integer portion of the ratio is converted into binary. Then a determination is made as to the number of bits required to store such a number. This number of bits equals the number of single-bit micro-counters required to be grouped. Then, the number N, and the number N+1 (i.e., ValA and ValB), as well as the NextGroup and PrevGroup information is stored in internal memory for use for the first X number of micro-counters in the chain.

Next, the decimal portion of the division ratio is addressed. The deviation from the desired ratio produced by using only the integer portion creates two "error" values. These values are then used to determine the ratio of N to N+1 that must be used to create the smallest combined error. These two new values M and M+1 are then stored, along with their grouping information, in the bit-field in internal memory. This error ratio calculation is repeated until the error is reduced to zero (or a desired amount) or until a sufficient bit-field is generated to use all available micro-counters in the chain. The bit-field is then sent to the circuit via the "SR" interface such that the configuration information is now stored in the micro-counters as desired.

Thus according to an embodiment of the invention, a first value corresponding to a non-integer ratio between an input signal and an output signal is received. A plurality of coefficients corresponding to the first value is calculated. Next, a first set of data is created that is comprised of data corresponding to the plurality of coefficients and of data for grouping a plurality of single-bit counters into a plurality of counter groups, or macro-counters. In creating this first set of data, a plurality of binary values as a function of the plurality of coefficients is created. The counters in each of the plurality of counter groups are assembled in order of significant bits of at least one of the plurality of binary values.

Each group of the plurality of counter groups has associated therewith at least one of the plurality of coefficients and is adapted to produce an output pulse for at least one predetermined number of input pulses in accordance with at least one of the plurality of coefficients. The number of counters in each group of the plurality of counter groups corresponds to a number of binary bits required to represent an integer value corresponding to the at least one of the plurality of coefficients.

Next, the first set of data is transmitted to the plurality of counters. Finally, the output signal is generated by using the plurality of counter groups, wherein a relationship between the input signal and the output signal is on average the ratio.

Figure 9:
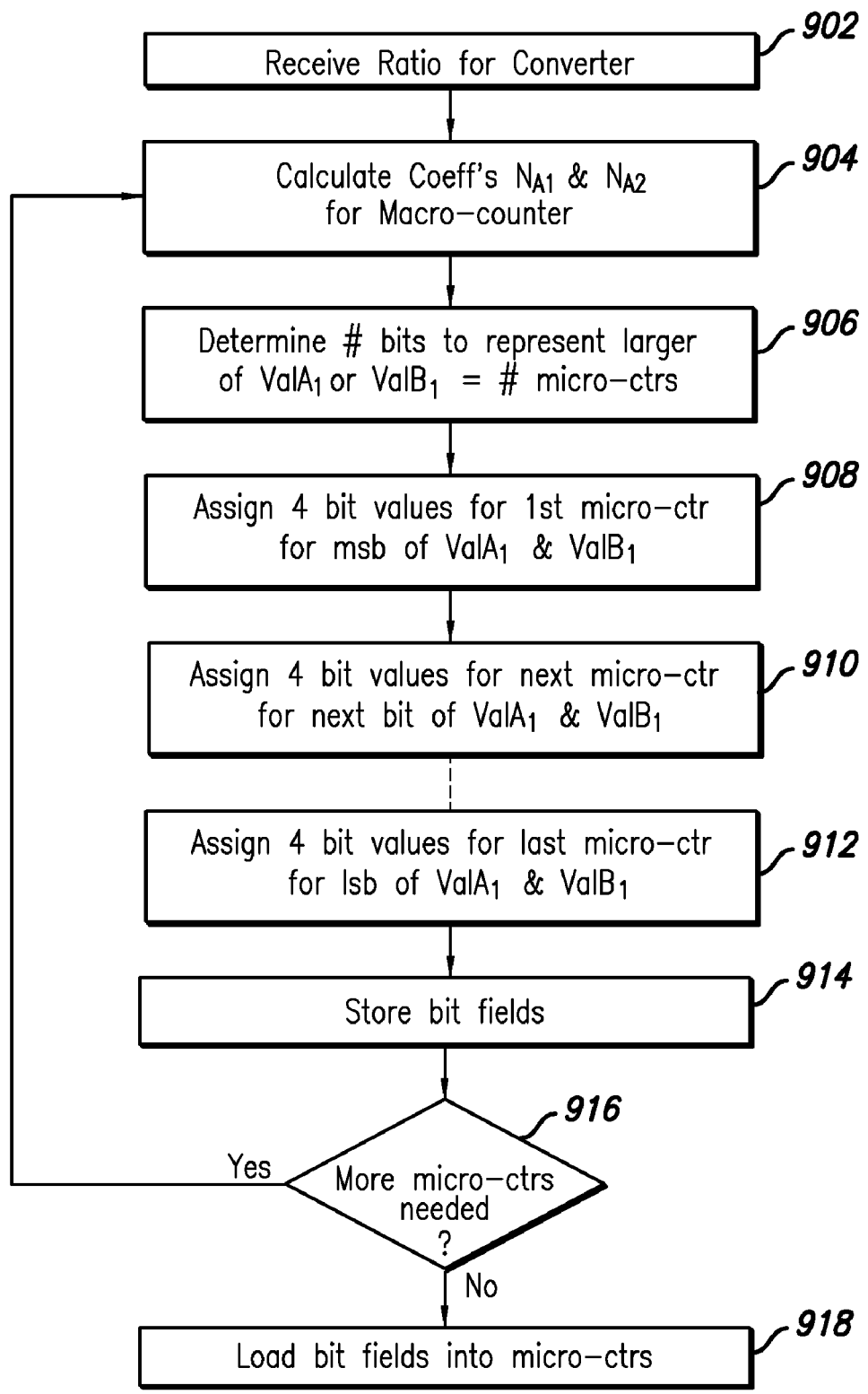
FIG. 9 shows a method of configuring micro-counters in accordance with an embodiment of the invention.

FIG. 9 depicts a method of configuring micro-counters in accordance with an embodiment of the invention. First, the design ratio of the converter is received. This ratio is a value corresponding to a non-integer ratio between an input signal and an output signal. (Step 902) Next, the maximum coefficients (CoeffA, CoeffB) for the first macro-counter are calculated. (Step 904) The method of calculating such coefficients has been previously described. The number of binary bits required to represent the larger of the two counter values that correspond to the two coefficients is determined. (Step 906) This number of binary bits is therefore equal to the number of single bit micro-counters that will be used to make up the first macro-counter. Note that since a counter starts at zero (0) and counts up from that value, then a counter value is equal to its corresponding coefficient minus one (1). Thus for example, where it is determined that the two coefficients for the first macro-counter are 5 and 6, then the corresponding counter values will be 4 and 5, respectively.

The micro-counters are assembled in order of significant bits from the most significant bit ("msb") to the least significant bit ("lsb") of the two counter values (i.e., ValA and ValB) that correspond to the two coefficients for the first macro-counter. Thus the first bit field for the first micro-counter relates to the msb of the first macro-counter's coefficients as follows:

ValueA=msb of the first counter value (will be a 1 or a 0);

ValueB=msb of the second counter value (will be a 1 or a 0);

PrevGrp=0 (because this micro-counter is not grouped with any previous micro-counter since it is the first micro-counter in the group); and NextGrp=1 (because this micro-counter is grouped with a following micro-counter in this group). (Step 908)

The next bit field is for the next micro-counter in the chain of micro-counters that make up the first macro-counter and relates to the next bit after the msb of the first macro-counter's coefficients as follows:

ValueA=next bit of the first counter value (will be a 1 or a 0);

ValueB=next bit of the second counter value (will be a 1 or a 0);

PrevGrp=1 (because this micro-counter is grouped with a previous micro-counter since this is an intermediate micro-counter in the group); and NextGrp=1 (because this micro-counter is grouped with a following micro-counter in this group). (Step 910)

Any additional bit fields for any subsequent micro-counters in the chain follow the same pattern as described above, until the final micro-counter is addressed. The last bit field is for the last micro-counter and relates to the lsb of the macro-counter's coefficients as follows:

ValueA=lsb of the first counter value (will be a 1 or a 0);

ValueB=lsb of the second counter value (will be a 1 or a 0);

PrevGrp=1 (because this micro-counter is grouped with a previous micro-counter since this is the last micro-counter in the group); and NextGrp=0 (because this micro-counter is not grouped with a following micro-counter since this is the last micro-counter in this group). (Step 912)

As stored in a straight binary format, the above-described bit fields would appear as follows for a group of N micro-counters that make up one macro-counter:

$ValueA_1$, $ValueB_1$, $PrevGrp_1$, $NextGrp_1$, $ValueA_2$, $ValueB_2$, $PrevGrp_2$, $NextGrp_2$ . . . $ValueA_N$, $ValueB_N$, $PrevGrp_N$, $NextGrp_N$. (Step 914)

The format for the above using exemplary, assigned binary values would be:

0101 1011 . . . 1110.

If more macro-counters are required for the converter (due to the existence of additional coefficients that are generated), then the process starting at step 904 is repeated for the micro-counters making up the next macro-counter. (Step 916) Once all of the bit field data for all required micro-counters is created and stored, the bit fields are loaded into the micro-counters for operation of the converter. (Step 918)

The following is an illustrative example of a method of creating a bit field in accordance with an embodiment of the invention. Assume that for one macro-counter, the coefficients (CoeffA, CoeffB) are determined to be 9 and 8. Because the macro-counters start at the value of zero (0) and count up to some maximum value (or vice versa), the corresponding counter values (ValA, ValB) would be values that are one (1) less than the coefficients, or 8 and 7, respectively. Next, these counter values are converted to binary values and a determination is made as to the number of binary bits needed to represent the larger of the two counter values. The binary value for 8=1000, and the binary value for 7=111. Therefore a total of four (4) binary bits are required to represent the value of 8, and thus four (4) micro-counters will need to be chained to create a macro-counter having the coefficients of 9 and 8 (i.e., having the counter values of 8 and 7). The following Table A represents the bit fields that are created for this example:

TABLE A

| Bit-field or Micro-ctr Number | Bit order | Counter Value = 8 (Val A) | Counter Value = 7 (Val B) | Prev Grp | Next Grp |
| --- | --- | --- | --- | --- | --- |
| 1 | msb | 1 | 0 | 0 | 1 |
| 2 | intermediate | 0 | 1 | 1 | 1 |
| 3 | intermediate | 0 | 1 | 1 | 1 |
| 4 | lsb | 0 | 1 | 1 | 0 |

Thus reading down the column for ValA, in order from msb to lsb, it can be seen that the binary value is 1000 which corresponds to decimal numeral 8. Similarly, the column for ValB shows the binary value of 0111 corresponding to decimal numeral 7. The bit fields for the micro-counters are assembled in order of msb to lsb for the two counter values. Therefore, the data for micro-counter one appears in the first row of Table A where the ValA, ValB, PrevGrp and NextGrp bit assignments appear. For this micro-counter, ValA=1 and ValB=0, since these are the most significant bits (msb) of the decimal values 1000 and 0111, respectively.

Because micro-counter one is the first counter in the chain, there is no counter in the group ahead of it, and therefore the binary value of "0" is assigned for PrevGrp. The binary value of "1" for NextGrp is assigned for micro-counter one since there is a micro-counter following it in this chain. The remaining three micro-counters are assigned binary values in a similar fashion. Note that the PrevGrp and NextGrp values are both="1" for the two intermediate micro-counters, since they both have counters that precede and follow them. However micro-counter four has PrevGrp=1 and NextGrp=0, since it has a micro-counter that precedes it, but no micro-counter follows it due to its last position in this grouping of micro-counters.

As stored in straight binary format, the bit fields for this macro-counter having coefficients of 9 and 8 (i.e., counter values of 8 and 7) would appear in the order as read from the rows of Table A as follows:

1001 0111 0111 0110

The above-described process continues for the micro-counters that make up the remaining macro-counters in the bi-directional converter thereby generating further bit fields for these micro-counters. Once all of the bit fields are generated and stored as described above, they are then loaded into the micro-counters themselves in order to configure them for operation as macro-counters. According to one embodiment of the invention, there is a four-bit-wide data bus (i.e., the "SR," or shift-register, bus) that is used to transfer the configuration data into the single-bit, micro-counters. This bus is chained between all the micro-counters such that on each clock signal ("the SR_Clock") of the bus, each counter passes its current four bits of data down to the next one in the chain.

The first counter in the chain receives its data from the external circuitry, such as the circuitry used to calculate the configuration data above. In this way, a data shift is executed for each counter needed in the chain, starting with the last bit's data first. Using the example above, there would be four shift operations needed, and they would happen in the following order: bit-field4 (0110), then bit-field3 (0111), then bit-field2 (0111) and finally bit-field1 (1001). Because of the way the shift operation happens, this then leaves counter 1 loaded with bit-field 1, counter 2 with bit-field 2, and so on.

While the above-described embodiment discusses a data bus that transfers data to the micro-counters in serial fashion, the inventions herein are by no means limited to this. Alternative embodiments include the use of a parallel bus connected to all micro-counters thereby loading the data in such a fashion. Other data connection arrangements, known in the art, may be used as well.

Thus it can be seen that a chain of micro-counters can be re-configured to create different chains of macro-counters, thus allowing a static chain of counter circuitry to change maximum counter coefficients and counter sizes to allow for different circuit operation. A plurality of micro-counters is connected together in a chain as shown in FIGS. 6 and 7. The macro-counters have the basic operation as described above with reference to FIGS. 2, 3, 4a and 4b. This therefore allows for a field-configurable implementation while optimizing the logic or hardware space needed in the physical implementation.

Possible physical circuit implementations include discrete logic circuits, complex programmable logic devices (CPLDs), field programmable gate arrays (FPGAs) and application specific integrated circuits (ASICs). Other logic devices may be used as well. Also described is a method for calculating the configuration bit-field to be loaded through the shift register for proper circuit operation. According to one embodiment, a program is written in assembly language to allow a very basic embedded microprocessor to be included in the implementation. The desired effect of the circuit is that the output signal of the converter will be a certain non-integer ratio less than the input signal.

While the description above refers to particular embodiments of the present invention, it will be understood that many modifications may be made without departing from the spirit thereof. The claims are intended to cover such modifications as would fall within the true scope and spirit of the present invention. The presently disclosed embodiments are therefore to be considered in all respects as illustrative and not restrictive, the scope of the invention being indicated by the claims rather than the foregoing description, and all changes which come within the meaning and range of equivalency of the claims are therefore intended to be embraced therein.

What is claimed is:

1. A method for converting signals comprising:
   receiving a first value corresponding to a ratio between an input signal and an output signal, wherein the ratio is a non-integer;
   calculating a plurality of coefficients corresponding to the first value;
   creating a first set of data comprised of data corresponding to the plurality of coefficients and of data for grouping a plurality of counters into a plurality of counter groups; and
   generating the output signal by using the plurality of counter groups, wherein a relationship between the input signal and the output signal is on average the ratio.

2. The method of claim 1 wherein the first set of data is bit field data.

3. The method of claim 1 wherein each of the plurality of counter groups is adapted to produce an output pulse for at least one predetermined number of input pulses in accordance with at least one of the plurality of coefficients.

4. The method of claim 1 wherein each of the plurality of counters is a single-bit counter, and wherein the first set of data is bit field data.

5. The method of claim 4 wherein creating the first set of data includes creating a plurality of binary values as a function of the plurality of coefficients, and wherein each group of the plurality of counter groups has associated therewith at least one of the plurality of coefficients, and wherein the number of counters in each group of the plurality of counter groups corresponds to a number of binary bits required to represent an integer value corresponding to the at least one of the plurality of coefficients.

6. The method of claim 5 wherein the plurality of counters in each of the plurality of counter groups are assembled in order of significant bits of at least one of the plurality of binary values.

7. The method of claim 1 wherein calculating the plurality of coefficients comprises:
   setting a first coefficient to be equal to an integer portion of the ratio;
   setting a second coefficient to be equal to one of the first coefficient plus 1 and the first coefficient minus 1;
   calculating a first error value according to a first deviation from the ratio by using only the first coefficient;
   calculating a second error value according to a second deviation from the ratio by using only the second coefficient;
   calculating a third coefficient as a function of the first error value and the second error value; and
   setting a fourth coefficient to be equal to one of the third coefficient plus 1 and the third coefficient minus one.

8. The method of claim 1 further comprising transmitting the first set of data to the plurality of counters.

9. The method of claim 8 wherein transmitting the first set of data includes transmitting the first set of data using a four-bit wide data bus.

10. The method of claim 9 wherein the data bus is chained between each of the plurality of counters such that on each clock signal of the data bus, one counter of the plurality of counters passes a portion of the first set of data to another counter of the plurality of counters located immediately downstream of the one counter.

11. The method of claim 1, wherein the plurality of counters are implemented in one of a complex programmable logic device (CPLD), a field programmable gate array (FPGA), and an application specific integrated circuit (ASIC).

12. A method for converting signals comprising:
receiving a first value corresponding to a ratio between an input signal and an output signal, wherein the ratio is a non-integer;
calculating a plurality of coefficients corresponding to the first value;
creating a first set of data comprised of data corresponding to the plurality of coefficients and of data for grouping a plurality of counters into a plurality of counter groups,
wherein each of the plurality of counter groups is adapted to produce an output pulse for at least one predetermined number of input pulses in accordance with at least one of the plurality of coefficients,
wherein each of the plurality of counters is a single-bit counter, and
wherein the first set of data is bit field data; and
generating the output signal by using the plurality of counter groups, wherein a relationship between the input signal and the output signal is on average the ratio.

13. The method of claim 12 further comprising transmitting the first set of data to the plurality of counters.

14. The method of claim 12 wherein creating the first set of data includes creating a plurality of binary values as a function of the plurality of coefficients, and wherein each group of the plurality of counter groups has associated therewith at least one of the plurality of coefficients, and wherein the number of counters in each group of the plurality of counter groups corresponds to a number of binary bits required to represent an integer value corresponding to the at least one of the plurality of coefficients.

15. The method of claim 14 wherein the plurality of counters in each of the plurality of counter groups are assembled in order of significant bits of at least one of the plurality of binary values.

16. The method of claim 12 wherein calculating the plurality of coefficients comprises:
setting a first coefficient to be equal to an integer portion of the ratio;
setting a second coefficient to be equal to one of the first coefficient plus 1 and the first coefficient minus 1;
calculating a first error value according to a first deviation from the ratio by using only the first coefficient;
calculating a second error value according to a second deviation from the ratio by using only the second coefficient;
calculating a third coefficient as a function of the first error value and the second error value; and
setting a fourth coefficient to be equal to one of the third coefficient plus 1 and the third coefficient minus one.

17. A system for converting an input signal to an output signal, the system comprising:
a processing unit capable of executing software routines;
a logic circuit comprised of a plurality of counters; and
programming logic executed by the processing unit, wherein the programming logic comprises:
means for receiving a first value corresponding to a ratio between the input signal and the output signal, wherein the ratio is a non-integer;
means for calculating a plurality of coefficients corresponding to the first value; and
means for creating a first set of data comprised of data corresponding to the plurality of coefficients and of data for grouping the plurality of counters into a plurality of counter groups; and
wherein the plurality of counter groups is adapted to generate the output signal, and wherein a relationship between the input signal and the output signal is on average the ratio.

18. The system of claim 17 wherein the system further comprises means for transmitting the first set of data to the plurality of counters.

19. The system of claim 17 wherein each of the plurality of counter groups is adapted to produce an output pulse for at least one predetermined number of input pulses in accordance with at least one of the plurality of coefficients.

20. The system of claim 17 wherein each of the plurality of counters is a single-bit counter, and wherein the first set of data is bit field data.

21. The system of claim 20 wherein the means for creating the first set of data includes means for creating a plurality of binary values as a function of the plurality of coefficients, wherein each group of the plurality of counter groups has associated therewith at least one of the plurality of coefficients, and wherein the number of counters in each group of the plurality of counter groups corresponds to a number of binary bits required to represent an integer value corresponding to the at least one of the plurality of coefficients.

22. The system of claim 21 wherein the plurality of counters in each of the plurality of counter groups are assembled in order of significant bits of at least one of the plurality of binary values.

23. The system of claim 17 wherein the means for calculating the plurality of coefficients comprises:
means for setting a first coefficient to be equal to an integer portion of the ratio;
means for setting a second coefficient to be equal to one of the first coefficient plus 1 and the first coefficient minus 1;
means for calculating a first error value according to a first deviation from the ratio by using only the first coefficient;
means for calculating a second error value according to a second deviation from the ratio by using only the second coefficient;
means for calculating a third coefficient as a function of the first error value and the second error value; and
means for setting a fourth coefficient to be equal to one of the third coefficient plus 1 and the third coefficient minus one.

24. The system of claim 17 wherein the logic circuit is comprised of one of a complex programmable logic device (CPLD), a field programmable gate array (FPGA), and an application specific integrated circuit (ASIC).

* * * * *